(12) United States Patent
Davis, Jr. et al.

(10) Patent No.: US 6,465,272 B1
(45) Date of Patent: Oct. 15, 2002

(54) EXTREME ULTRAVIOLET SOFT X-RAY PROJECTION LITHOGRAPHIC METHOD AND MASK DEVICES

(75) Inventors: Claude L. Davis, Jr., Painted Post, NY (US); Kenneth E. Hrdina, Horseheads, NY (US); Robert Sabia, Big Flats, NY (US); Harrie J. Stevens, Corning, NY (US)

(73) Assignee: Corning Incorporated, Corning, NY (US)

( * ) Notice: Subject to any disclaimer, the term of this patent is extended or adjusted under 35 U.S.C. 154(b) by 67 days.

(21) Appl. No.: 09/615,621

(22) Filed: Jul. 13, 2000

Related U.S. Application Data

(60) Provisional application No. 60/145,057, filed on Jul. 22, 1999, and provisional application No. 60/149,840, filed on Aug. 19, 1999.

(51) Int. Cl.$^7$ ............................................. H01L 21/00
(52) U.S. Cl. .................... 438/72; 438/947; 438/974; 438/736
(58) Field of Search ................. 438/947, 950, 438/974, 736, 56, 57, 69, 71, 72

(56) References Cited

U.S. PATENT DOCUMENTS

| | | | |
|---|---|---|---|
| 2,239,551 A | 4/1941 | Dalton et al. ............... | 49/79 |
| 2,272,342 A | 2/1942 | Hyde .......................... | 49/78.1 |
| 2,326,059 A | 4/1943 | Nodberg .................... | 100/52 |
| 4,002,512 A | 1/1977 | Lim ............................ | 148/187 |
| 4,184,078 A | 1/1980 | Nagel et al. ............... | 250/492 |

(List continued on next page.)

FOREIGN PATENT DOCUMENTS

| | | | |
|---|---|---|---|
| EP | 0 055 077 | 6/1982 | |
| EP | 0 252 734 | 1/1988 | ............ G03F/7/20 |
| EP | 0 279 670 | 8/1988 | ............ G03F/1/00 |
| EP | 0 569 123 | 11/1993 | ............ G03F/1/14 |

(List continued on next page.)

OTHER PUBLICATIONS

S. E. Gianoulakis, et al. "Thermal management of EUV lithography masks using low ecpansion glass substrates" Proc. SPIE vol. 3676, pt. 1–2, p. 598–605. (Mar. 15–17, 1999), Abstract.*

(List continued on next page.)

*Primary Examiner*—Caridad Everhart
(74) *Attorney, Agent, or Firm*—Edward F. Murphy

(57) ABSTRACT

The present invention relates to reflective masks and their use for reflecting extreme ultraviolet soft x-ray photons to enable the use of extreme ultraviolet soft x-ray radiation projection lithographic methods and systems for producing integrated circuits and forming patterns with extremely small feature dimensions. The projection lithographic method includes providing an illumination sub-system for producing and directing an extreme ultraviolet soft x-ray radiation $\lambda$ from an extreme ultraviolet soft x-ray source; providing a mask sub-system illuminated by the extreme ultraviolet soft x-ray radiation $\lambda$ produced by the illumination sub-system and providing the mask sub-system includes providing a patterned reflective mask for forming a projected mask pattern when illuminated by radiation $\lambda$. Providing the patterned reflective mask includes providing a Ti doped high purity $SiO_2$ glass wafer with a patterned absorbing overlay overlaying the reflective multilayer coated Ti doped high purity $SiO_2$ glass defect free wafer surface that has an Ra roughness$\leq$0.15 nm. The method includes providing a projection sub-system and a print media subject wafer which has a radiation sensitive wafer surface wherein the projection sub-system projects the projected mask pattern from the patterned reflective mask onto the radiation sensitive wafer surface.

47 Claims, 9 Drawing Sheets

U.S. PATENT DOCUMENTS

| | | | |
|---|---|---|---|
| 4,231,657 A | 11/1980 | Iwamatsu | 355/71 |
| 4,344,816 A | 8/1982 | Craighead et al. | 156/643 |
| 4,411,013 A | 10/1983 | Takasu et al. | 378/34 |
| 4,776,696 A | 10/1988 | Hettrick et al. | 356/328 |
| 4,911,513 A | 3/1990 | Valette | 350/96.12 |
| 5,003,567 A | 3/1991 | Hawryluk et al. | 378/34 |
| 5,016,265 A | 5/1991 | Hoover | 378/43 |
| 5,043,002 A | 8/1991 | Dobbins et al. | 65/3.12 |
| 5,051,326 A | 9/1991 | Celler et al. | 430/5 |
| 5,146,482 A | 9/1992 | Hoover | 378/43 |
| 5,146,518 A | 9/1992 | Mak et al. | 385/41 |
| 5,152,819 A | 10/1992 | Blackwell et al. | 65/3.12 |
| 5,154,744 A | 10/1992 | Blackwell et al. | 65/3.12 |
| 5,165,954 A | 11/1992 | Parker et al. | 427/526 |
| 5,173,930 A | 12/1992 | Hoover | 378/85 |
| 5,220,590 A | 6/1993 | Bruning et al. | 378/34 |
| 5,304,437 A | 4/1994 | Tennant | 430/5 |
| 5,315,629 A * | 5/1994 | Jewell et al. | 378/34 |
| 5,328,784 A | 7/1994 | Fukuda | 430/5 |
| 5,332,702 A | 7/1994 | Sempolinski et al. | 501/106 |
| 5,353,322 A | 10/1994 | Bruning et al. | 378/34 |
| 5,356,662 A | 10/1994 | Early et al. | 427/140 |
| 5,389,445 A | 2/1995 | Makowiecki et al. | 428/457 |
| 5,395,413 A | 3/1995 | Sempolinski et al. | 65/414 |
| 5,395,738 A | 3/1995 | Brandes et al. | 430/296 |
| 5,510,230 A | 4/1996 | Tennant et al. | 430/325 |
| 5,521,031 A | 5/1996 | Tennant et al. | 430/5 |
| 5,553,110 A | 9/1996 | Sentoku et al. | 378/35 |
| 5,565,030 A | 10/1996 | Kado et al. | 117/89 |
| 5,605,490 A | 2/1997 | Laffet et al. | 451/36 |
| 5,637,962 A | 6/1997 | Prono et al. | 315/111.21 |
| 5,686,728 A | 11/1997 | Shafer | 250/492.2 |
| 5,698,113 A | 12/1997 | Baker et al. | 216/72 |
| 5,737,137 A | 4/1998 | Cohen et al. | 359/859 |
| 5,815,310 A | 9/1998 | Williamson | 359/365 |
| 5,868,605 A | 2/1999 | Cesna | 451/41 |
| 5,880,891 A | 3/1999 | Furter | 359/651 |
| 5,970,751 A | 10/1999 | Maxon et al. | 65/414 |
| 5,989,776 A | 11/1999 | Felter et al. | 430/270.1 |
| 6,013,399 A | 1/2000 | Nguyen | 430/5 |
| 6,048,652 A | 4/2000 | Nguyen et al. | 430/5 |
| 6,118,577 A | 9/2000 | Sweatt et al. | 359/351 |
| 6,199,991 B1 | 3/2001 | Braat | 359/856 |
| 6,280,294 B1 * | 8/2001 | Miyamoto | 451/34 |
| 6,299,318 B1 | 10/2001 | Braat | 359/856 |
| 6,312,317 B1 * | 11/2001 | Oguma | 451/42 |

FOREIGN PATENT DOCUMENTS

| | | | |
|---|---|---|---|
| EP | 0 708 367 | 4/1996 | G03F/1/00 |
| EP | 0 710 890 | 5/1996 | G03F/7/20 |
| EP | 0 779 528 | 6/1997 | G02B/17/08 |
| EP | 0 809 125 | 11/1997 | G02B/6/38 |
| EP | 0 903 605 | 3/1999 | G02B/13/14 |
| JP | 60-173551 | 9/1985 | G03C/5/08 |
| JP | 63-142301 | 6/1988 | G02B/1/10 |
| JP | 63-142302 | 6/1988 | G02B/1/10 |
| WO | 87/06028 | 10/1987 | G03F/1/00 |
| WO | 98/34234 | 8/1998 | G21G/4/00 |

OTHER PUBLICATIONS

Gianoulakis et al., Thermal management of EUV lithography masks using low expansion glass substrates, Proceedings of the SPIE—The International Society for Optical Engineering (1991), vol. 3676, pt. 1–2, p. 598–605.

Properties of Corning's Glass and Glass Ceramic Families, pp. 1–23, 1979.

P. C. Shultz et al., Ultra–Low–Expansion Glasses and Their Structure in the $SiO_2$ and $TiO_2$ System, presented to the Third International Conference on the Physics of Noncrystalline Solids, Sheffield University, Sep. 1970.

Extreme Ultraviolet Lithography, A White Paper Prepared by: Charles Gwyn, et al. EUV LLC, Livermore, CA, Nov. 1999, pp. 96–141.

Tanya E. Jewell, Four–Mirror Ring–Field System for EUV Projection Lithography, 1994, pp. 98–102.

High Purity Quartz Glass Products, May 17,1999, htpp://www.toshiba–ceramics.com/quartz.html, pp. 1–2.

Shin–Etsu Chemical Homepage, Semiconductor Materials Division, May 17, 1999, http://www.shinetsu.co.jp/english/profile/division/sem–div/sem–div.html, pp. 1–2.

Isimoto Co., Ltd., Products for Optics, May 17, 1999, http://www.isimoto.ocm/isimoto/english/variation3.html, pp. 1–2.

Ishimoto Co., Ltd., Product Information, May 17, 1999, http://www.isimoto.ocm/isimoto/english/procuct _info.html, pp. 1–4.

Isimoto Co., Ltd., Purity and Chemical Reactivity, May 17, 1999, http://www.isimoto.ocm/isimoto/english/feature1.html, pp. 1–3.

The Optics Mall—Equipment/Supplies, Universal Photonics, Inc., Jul. 7, 1999, p. 1.

Rodel Authored Papers: A Study of the Variation of Physical Properties in Ramdom Lots of Urethane Polishing Pads for CMP, Jul. 7, 1999, http://www.rodel.com/publications/paper1.asp, pp. 1–4.

Rodel Publications Content, Rodel Authored Papers, Jul. 7, 1999, http://www.rodel.com/publications/content.asp, pp. 1–2.

Rodel Publications, Jul. 7, 1999, http://www.rodel.com/publications/default.asp, p. 1.

Cab–O–Sil Web Site, Jul. 7, 1999, http://www.cabot–corp.com/cabosil, pp. 1–3.

Optics and Photonics News, Aug. 1999, vol. 10, No. 8, Aug. 1999, pp. 34–38.

O.V. Mazurin, V. K. Leko and L.A. Komarova, Journal of Non–Crystalline Solids 18 (1975) 1–9, Crystallization of Silica and Titanium Oxide–Silica Corning Glasses (Codes 7940 and 7971), pp. 1–9.

S. T. Gulati and H.E. Hagy, Journal of the American Ceramic Society, vol. 61, No. 5–6, May–Jun., 1978, Theory of the Narrow Sandwich Seal, pp. 260–263.

George H. Beall, Industrial Applications of Silica, pp. 470–505, Reviews in Minerology (date unknown) 29.

H. E. Hagy and W. D. Shirkey, Determining absolute thermal expansion of titanica–silica glasses: a refined ultrasonic method, Sep. 1975, vol. 14, no. 9, applied Optics, pp. 2099–2103.

S. F. Jacobs et al., Surface figure changes due to thermal cycling hysteresis, Applied Optics, vol. 26, No. 20, Oct. 15, 1987, pp. 4438–4442.

C.W. Gwyn, R. Stulen, D. Sweeney and D. Attwood, Extreme Ultraviolet Lithography, pp. 1–9 and 1–6.

Richard H. Stulen and Donald W. Sweeney, Extreme Ultraviolet Lithography, IEEE Journal of Quantum Electronics, vol. 35, No. 5, May 1999, pp. 694–699.

William M. Tong, John S. Taylor, Stephen P. Vernon, Substrates Requirements For Extreme Ultraviolet Lithography, Lawrence Livermore National Laboratory.

EUV Lithography NGL Technology Review, Jun. 9, 1999.

* cited by examiner

EXTREME ULTRAVIOLET SOFT X-RAY PROJECTION LITHOGRAPHIC METHOD AND MASK DEVICES

This application claims the benefit of U.S. Provisional Application, Serial No. 60/145,057, filed Jul. 22, 1999 entitled Extreme Ultraviolet Soft X-Ray Projection Lithographic Method and Mask Devices, by Claude L. Davis, Robert Sabia and Harrie J. Stevens.

U.S. Provisional Application, Serial No. 60/149,840, filed Aug. 19, 1999 entitled Extreme Ultraviolet Soft X-Ray Projection Lithographic Method and Mask Devices, by Claude L. Davis, Kenneth E. Hrdina, Robert Sabia and Harrie J. Stevens.

BACKGROUND OF THE INVENTION

FIELD OF THE INVENTION

The present invention relates generally to projection lithographic methods and systems for producing integrated circuits and forming patterns with extremely small feature dimensions. The present invention relates particularly to extreme ultraviolet soft x-ray based lithography and reflective masks which reflect extreme ultraviolet soft x-ray radiation and form pattern images that are utilized to form circuit patterns. The present invention relates to reflective masks and their use for reflecting extreme ultraviolet soft x-ray photons to enable the use of extreme ultraviolet soft x-ray radiation for lithography that surpasses current optical lithography circuit feature dimension performance.

TECHNICAL BACKGROUND

The use of extreme ultraviolet soft x-ray radiation provides benefits in terms of achieving smaller feature dimensions but due to the nature of the radiation, it presents difficulties in terms of manipulating and directing such wavelengths of radiation and has delayed the commercial manufacturing use of such radiation. Current optical lithography systems used in the manufacturing of integrated circuits have progressed towards shorter optical wavelengths of light, such as from 248 nm to 193 nm to 157 nm, but the commercial use and adoption of extreme ultraviolet soft x-rays has been hindered. Part of this slow progression to very short wavelengths of radiation such as in the 15 nm range, has been due to the lack of economically manufacturable reflective mask wafers that can withstand the exposure to such radiation while maintaining a stable and high quality circuit pattern image. For the benefits of extreme ultraviolet soft x-rays to be utilized in the manufacturing of integrated circuits, there is a need for a stable glass wafer that allows for direct deposition of reflective coatings to the surface of the glass wafer.

As noted from U.S. Pat. No. 5,698,113, current extreme ultraviolet soft x-ray lithographic systems are extremely expensive. U.S. Pat. No. 5,698,113 tries to address such high costs by trying to recover the surfaces of multilayer coated substrates by etching the multilayer reflective coatings from substrate surfaces of fused silica and ZERODUR type aluminosilicate glass-ceramics, even though such etching degrades the substrate surface.

The present invention provides for an economically manufactured mask wafer that is stable, ready for direct coating and receptive to receiving multilayer reflective coatings and provides an improved extreme ultraviolet soft x-ray based projection lithography method/system. The present invention economically provides for improved mask wafer performance and stability without the need to recycle the mask wafer surface which has been shown to reduce performance and the reflectivity of the mask. The present invention provides a stable high performance reflective mask with the reflective multilayer coating directly deposited on the finished glass surface, and avoids costly and cumbersome manufacturing steps and intermediate layers between the glass substrate surface and the reflective multilayer coating.

SUMMARY OF THE INVENTION

One aspect of the present invention is a projection lithographic method/system for producing integrated circuits with printed feature dimensions less than 100 nm that includes providing an illumination sub-system for producing and directing an extreme ultraviolet soft x-ray radiation $\lambda$ from an extreme ultraviolet soft x-ray source. The method further includes providing a mask sub-system illuminated by the extreme ultraviolet soft x-ray radiation $\lambda$ produced by the illumination sub-system and providing the mask sub-system includes providing a patterned reflective mask for forming a projected mask pattern when illuminated by radiation $\lambda$. Providing the patterned reflective mask includes providing a Ti doped high purity $SiO_2$ glass wafer with a patterned absorbing overlay overlaying the reflective multilayer coated Ti doped high purity $SiO_2$ glass defect free wafer surface that has an Ra roughness$\leq 0.15$ nm. The method further includes providing a projection sub-system and an integrated circuit wafer which has a radiation sensitive wafer surface wherein the projection sub-system projects the projected mask pattern from the patterned reflective mask onto the radiation sensitive wafer surface.

In another aspect, the present invention includes a method of making a projection lithographic system and a method of projection lithography that includes providing an illumination sub-system which has an extreme ultraviolet soft x-ray source and providing a mask sub-system that has a mask receiving member and a reflective mask Ti doped high purity $SiO_2$ glass mask wafer with an unetched glass mask surface coated with a reflective multilayer coating having a reflectivity of at least 65% to extreme ultraviolet soft x-rays that is received in the mask receiving member. The method further includes providing a projection sub-system including a camera with a depth of focus $\geq 1$ $\mu$m and a numerical aperture NA$\leq 0.1$; providing a radiation sensitive print sub-system with a radiation sensitive print media; and aligning the illumination sub-system, the mask sub-system, the projection sub-system, and the radiation sensitive print sub-system wherein the extreme ultraviolet soft x-ray source illuminates the reflective mask with extreme ultraviolet soft x-ray radiation and forms a printing pattern which is projected by the projection sub-system camera onto said radiation sensitive print media.

The invention further includes a method of making a reflective extreme ultraviolet soft x-ray mask which includes the steps of: providing a Ti doped high purity $SiO_2$ glass preform having a preform surface and free of inclusions, finishing the preform surface into a planar mask wafer surface with an Ra surface roughness$\leq 0.15$ nm, and coating the finished planar mask wafer surface with a reflective multilayer coating to form a reflective mask surface having a reflectivity of at least 65% to extreme ultraviolet soft x-rays.

The invention also includes a reflective extreme ultraviolet soft x-ray mask wafer that comprises a Ti doped high purity $SiO_2$ inclusion-free glass wafer having an unetched first polished planar face surface and an opposing second polished planar face surface, with the first surface free of printable surface defects that have a dimension greater than 80 nm and has a Ra roughness≦0.15 nm.

The invention further includes a method of making a reflective extreme ultraviolet soft x-ray mask wafer that has the steps of: providing a Ti doped high purity $SiO_2$ glass preform with a first preform surface and an opposing second preform surface, and is free of inclusions, and finishing the first preform surface into a planar mask wafer surface having an Ra roughness≦0.15 nm.

Additional features and advantage of the invention will be set forth in the detailed description which follows, and in part will be readily apparent to those skilled in the art from that description or recognized by practicing the invention as described herein, including the detailed description which follows, the claims, as well as the appended Figures.

It is to be understood that both the foregoing general description and the following detailed description are merely exemplary of the invention, and are intended to provide an overview or framework for understanding the nature and character of the invention as it is claimed. The accompanying Figures are included to provide a further understanding of the invention, and are incorporated in and constitute a part of this specification. The Figures illustrate various embodiments of the invention, and together with the description serve to explain the principals and operation of the invention.

DETAILED DESCRIPTION OF THE PREFERRED EMBODIMENTS

Figure 1:
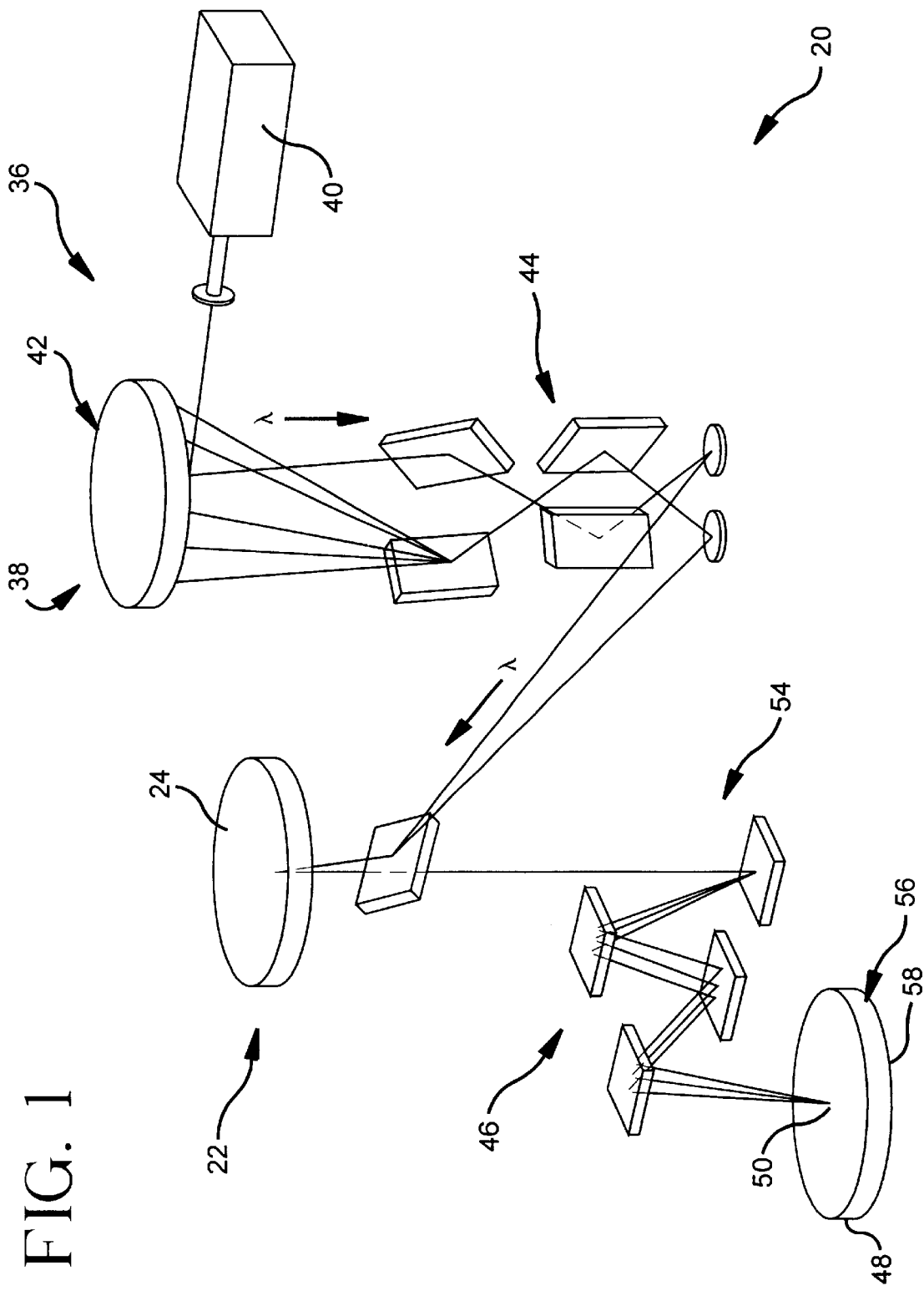
FIG. 1 is a diagrammatic depiction of an embodiment of the invention.

Reference will now be made in detail to the present preferred embodiments of the invention, examples of which are illustrated in the accompanying Figures. An exemplary embodiment of the projection lithographic method/system of the present invention is shown in FIG. 1 and is designated generally throughout by reference numeral 20.

In accordance with the invention, the present invention for a projection lithographic method includes providing a mask sub-system illuminated by extreme ultraviolet soft x-ray radiation λ produced by an illumination sub-system, with the mask sub-system including a patterned reflective mask for forming a projected mask pattern when illuminated by radiation λ with the patterned reflective mask including a Ti doped high purity $SiO_2$ glass wafer with a patterned absorbing overlay overlaying a reflective multilayer coated Ti doped high purity $SiO_2$ glass defect free wafer surface that has an Ra roughness≦0.15 nm.

Figure 2:
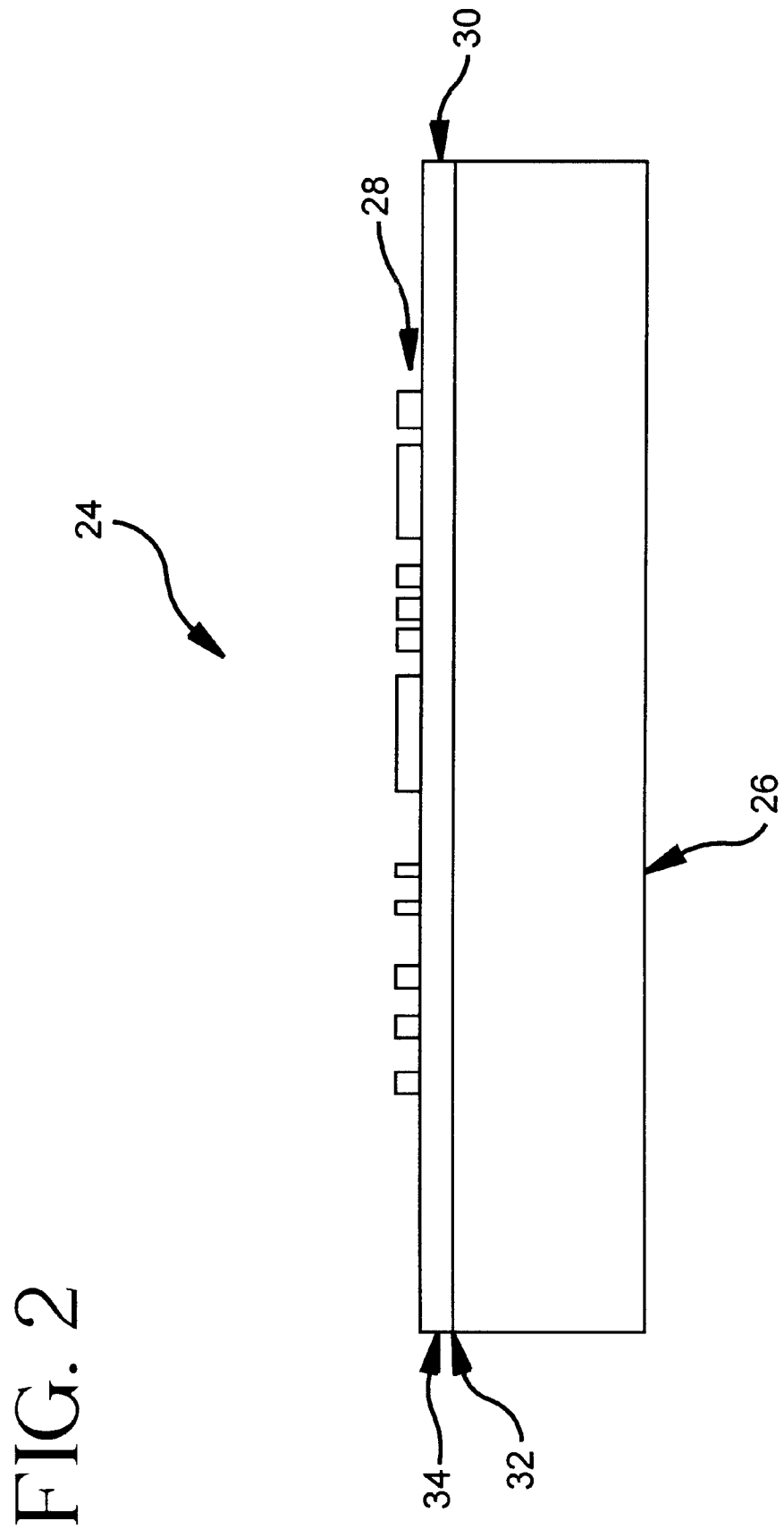
FIG. 2 is a side cross-section of an embodiment of the invention.
Figure 3:
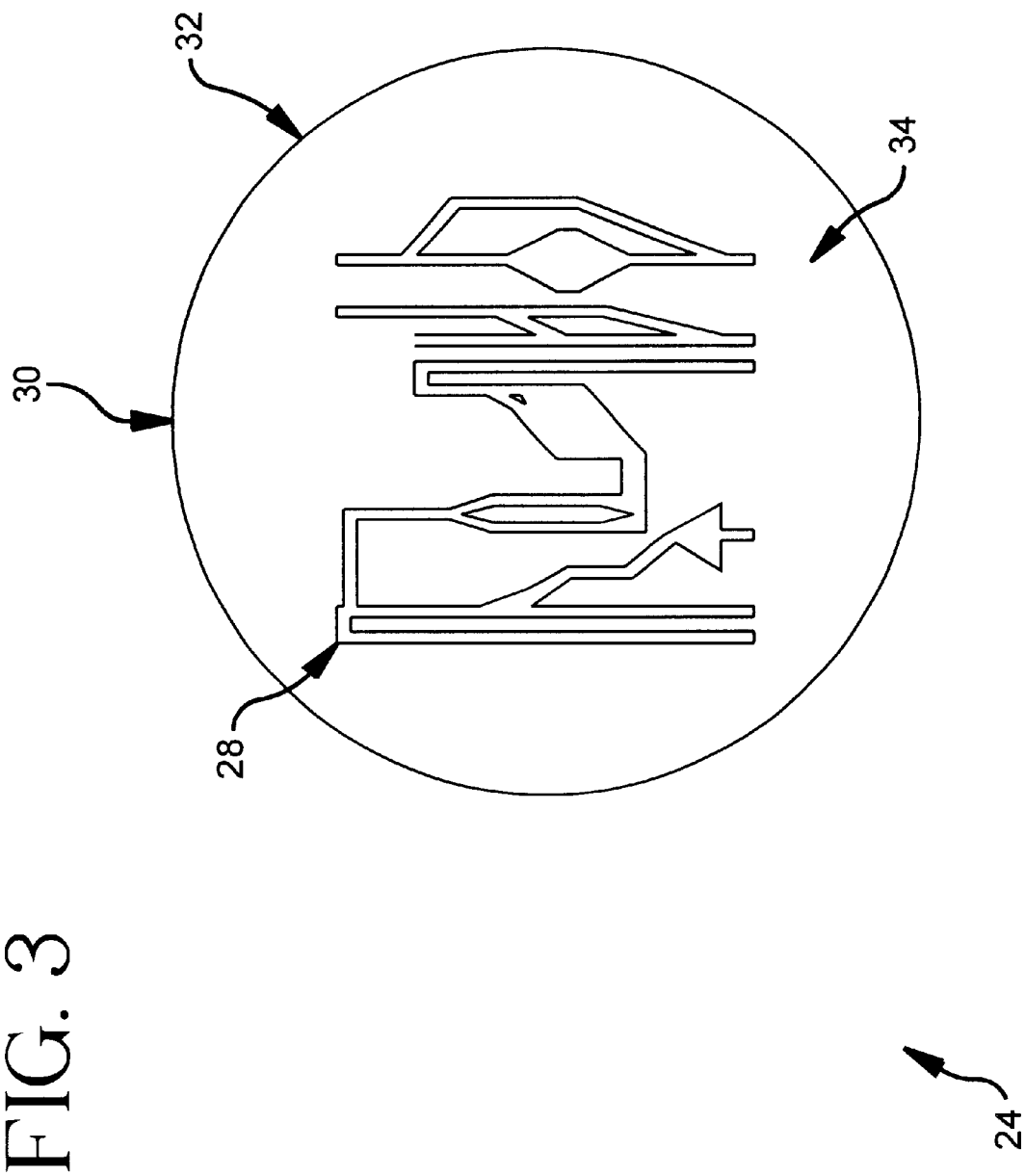
FIG. 3 is a top view of an embodiment of the invention.
Figure 4:
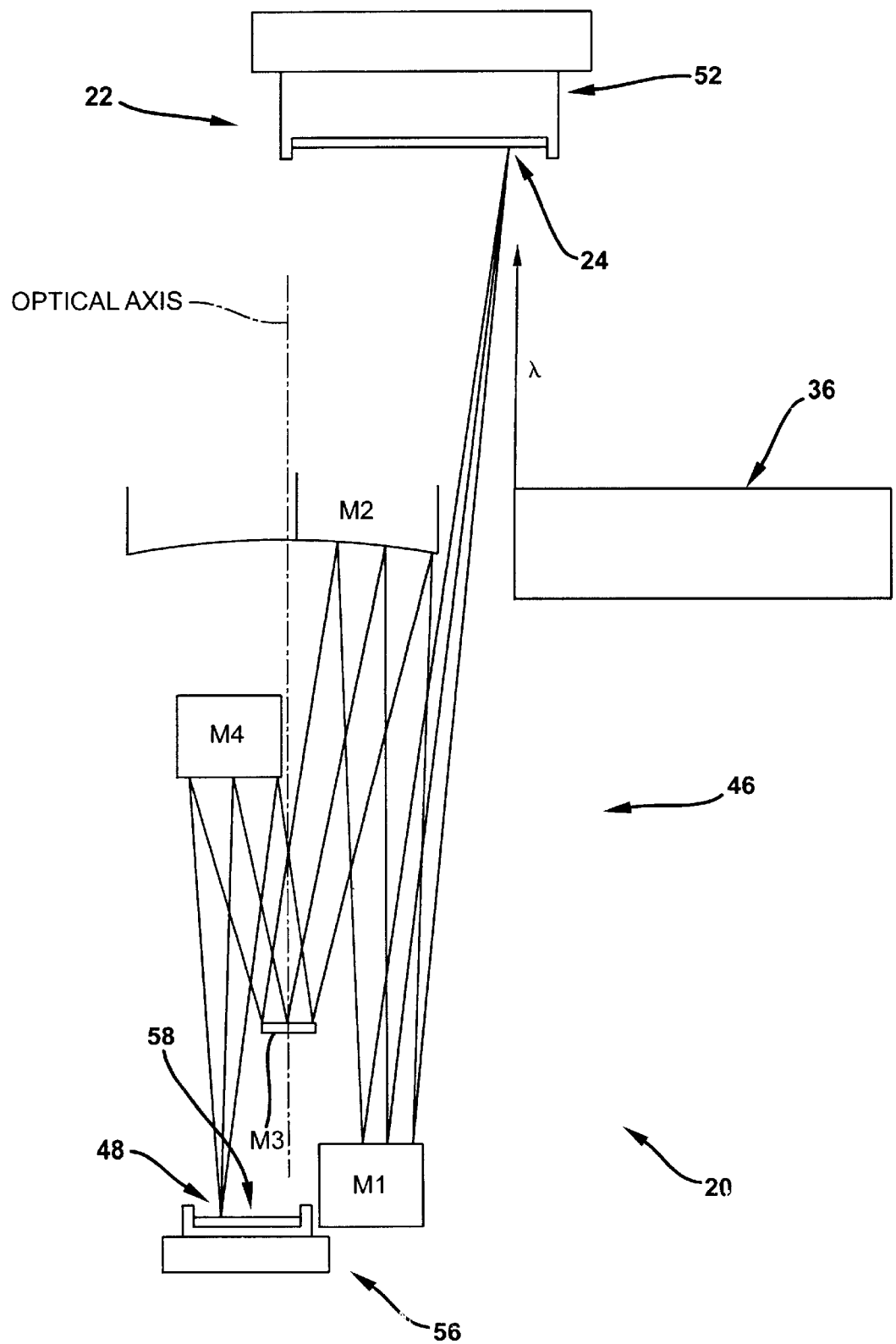
FIG. 4 is a diagrammatic depiction of an embodiment of the invention.

As embodied herein, and depicted in FIG. 1, projection lithographic method/system 20 comprises mask sub-system 22 which includes patterned reflective mask 24. As shown in FIGS. 2 and 3, patterned reflective mask 24 includes a Ti doped high purity $SiO_2$ glass wafer 26 with a patterned absorbing overlay 28 overlaying reflective multilayer coated Ti doped high purity $SiO_2$ glass defect free wafer surface 30. Reflective multilayer coated Ti doped high purity $SiO_2$ glass defect free wafer surface 30 is comprised of reflective multilayer coating 34 on wafer surface 32, with reflective multilayer coating 34 preferably directly coating Ti doped high purity $SiO_2$ glass wafer surface 32. FIG. 4 shows the optical alignment of projection lithographic method/system 20.

The projection lithographic method for producing integrated circuits with printed feature dimensions less than 100 nm includes providing illumination sub-system 36 for producing and directing extreme ultraviolet soft x-ray radiation λ. Illumination sub-system 36 includes extreme ultraviolet soft x-ray source 38. In a preferred embodiment, illumination sub-system 36 includes a 1.064 μm neodymium YAG laser 40 which produces a Xenon gas plasma 42 which outputs extreme ultraviolet soft x-ray radiation λ that is directed by condenser 44. Alternatively, extreme ultraviolet soft x-ray source 38 may comprise a synchrotron, discharge pumped x-ray lasers, an electron-beam driven radiation source device, or a radiation source based on high harmonic generation based on femto-second laser pulses.

Figure 5A:
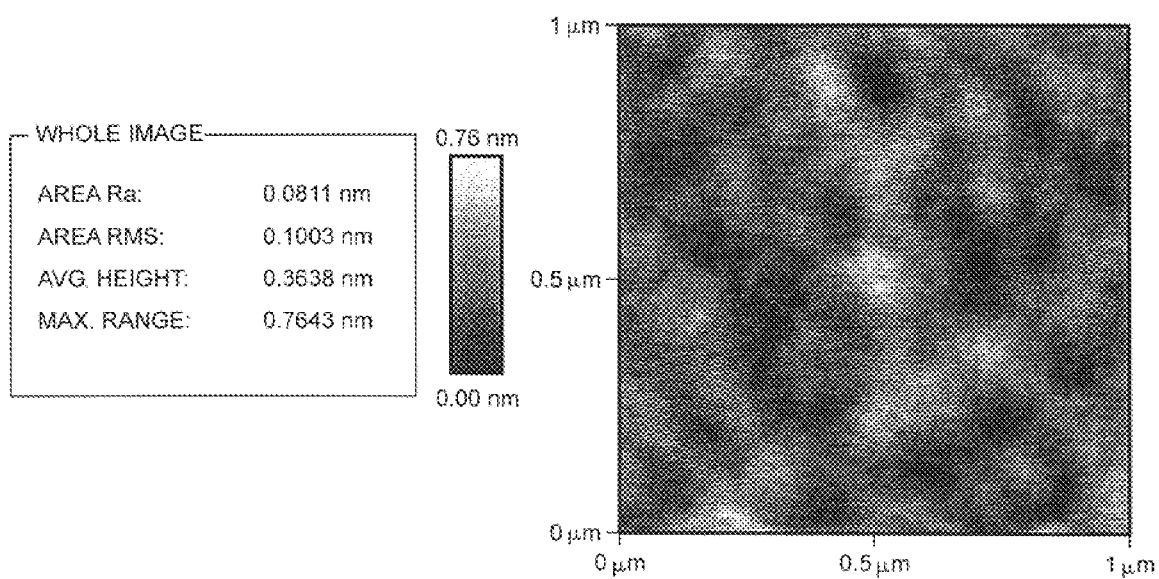
FIG. 5A is an AFM photomicrograph of an embodiment of the invention.
Figure 5B:
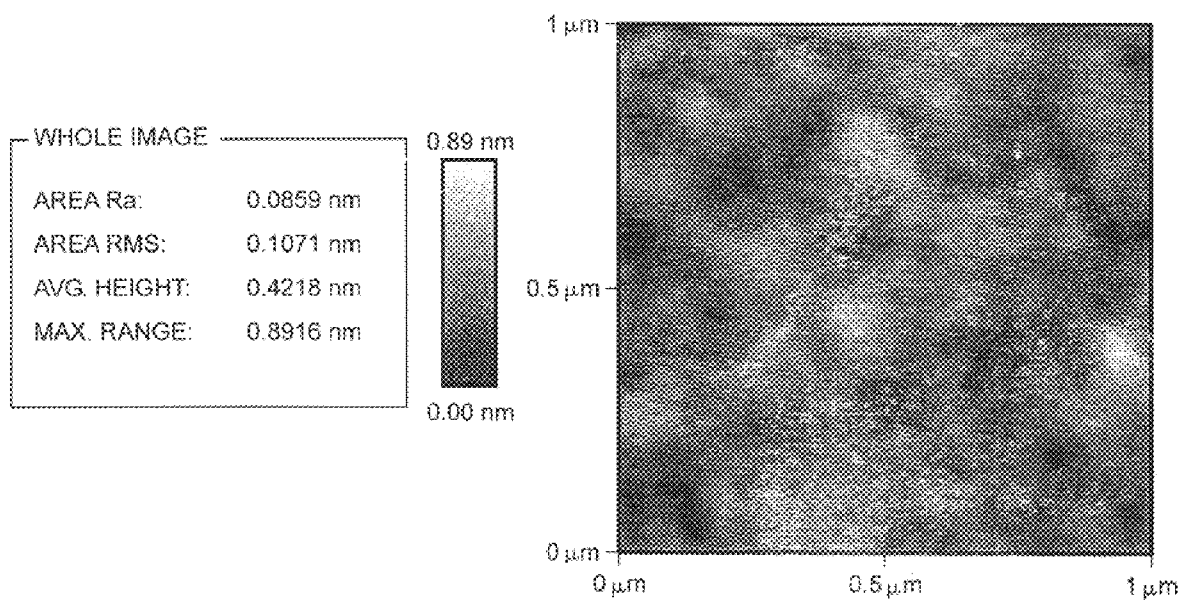
FIG. 5B is an AFM photomicrograph of an embodiment of the invention.

The projection lithographic method includes providing mask sub-system 22 which is illuminated by the extreme ultraviolet soft x-ray radiation λ produced by illumination sub-system 36. Providing mask sub-system 22 includes providing a patterned reflective mask 24 which forms a projected mask pattern when illuminated by the radiation λ. Providing mask 24 includes providing Ti doped high purity $SiO_2$ glass wafer 26 which has a patterned absorbing overlay 28 overlaying reflective multilayer coated Ti doped high purity $SiO_2$ glass defect free wafer surface 30. Ti doped high purity $SiO_2$ glass wafer surface 30 has an Ra roughness≦0.15 nm. Ti doped high purity $SiO_2$ glass wafer 26 is free of defect inclusions and is a noncrystalline amorphous homogeneous glass solid with wafer surface 30 having a very smooth planar surface that has an Ra roughness≦0.15 nm and inhibits scattering of radiation μ that is to be reflected by the mask. Such an Ra roughness is achieved by finishing the surface in accordance with the invention and is measured using Atomic Force Microscopy (AFM). FIGS. 5A–5B are AFM photomicrographs of a Ti doped high purity $SiO_2$ glass wafer surface of the invention which has an Ra roughness≦0.15 as determined by AFM measurements.

The method includes providing a projection sub-system 46 and an integrated circuit wafer 48 with a radiation sensitive wafer surface 50, wherein projection sub-system 46 projects the projected mask pattern from mask 24 onto radiation sensitive wafer surface 50. Preferably projection sub-system 46 is a series of four mirrors as shown in FIGS. 1 and 4 which reduce the size of the mask pattern and project the reduced pattern image onto wafer surface 50, with a 4× reduction power.

In a preferred embodiment, extreme ultraviolet soft x-ray radiation λ is in the range from about 5 nm to about 15 nm, and most preferably illumination sub-system 36 directs radiation centered about 13.4 nm to reflective mask 24 that has a reflectivity of at least 65% at 13.4 nm.

The provided Ti doped high purity $SiO_2$ glass wafer 26 is defect free in that the glass body is free of bulk glass defects and is free of inclusion, including glass voids and gas filled voids in the glass, and is particularly free of any such defects or imperfections that have a dimension greater than 80 nm.

In a particularly preferred embodiment, glass wafer surface 32 is an unetched glass surface that has been finished with polishing to a planar surface Ra roughness$\leq$0.15 nm. Wafer 26 Ti doped $SiO_2$ glass is substantially non-transmissive to extreme ultraviolet soft x-ray radiation $\lambda$ and the reflectivity of reflective coated wafer surface 30 and the ultra-low roughness of wafer surface 32 is utilized in the invention to inhibit scattering of illumination radiation and provide an ultra-stable high quality image on wafer surface 50 during the projection lithography process. The provided Ti doped high purity $SiO_2$ glass is preferably chlorine-free and preferably has an impurity level of less than 10 ppb of alkali and alkaline earth metals. Preferably the Ti doped high purity $SiO_2$ glass contains from 5 to 10 wt. % $TiO_2$ and has a coefficient of thermal expansion in the range from +30 ppb to −30 ppb at 20° C., and more preferably in the range from +10 ppb to −10 ppb at 20° C. Preferably wafer 26 has a variation in coefficient of thermal expansion throughout the wafer that is less than or equal to 15 ppb. Wafer 26 preferably has a thermal conductivity K$\leq$1.40 w/(m.° C.) at 25° C., more preferably in the range from 1.25 to 1.38, and most preferably about 1.31.

During projection lithography, wafer 26 is heated by the illumination of radiation $\lambda$, and even with such heating of the wafer the dimensions of the patterned absorbing overlay is substantially unaffected and changes of the projected image are inhibited and the quality of the projected image is maintained. In the inventive method, the Ti doped high purity $SiO_2$ glass wafer 26 is heated to an operating temperature by radiation $\lambda$ and preferably the glass wafer has an adjusted Ti dopant level adjusted such that the glass wafer has a coefficient of thermal expansion centered about 0 at such operating temperature. With such a thermal conductivity and coefficient of thermal expansion, wafer 26 provides appropriate operation and stability, and provides a highly reliable and economic lithographic method/system in which mask sub-system 22 does not require cooling. In a preferred embodiment, mask 24 and wafer 26 are not actively cooled and are free of a cooling system such as circulating cooling fluids, thermal electric coolers, or other means for removing heat build up.

The provided Ti doped high purity $SiO_2$ glass defect free wafer surface 32 has a finished planar surface, with the finished planar surface free of printable surface imperfections that have a dimension greater than 80 nm. Preferably the finished planar surface is free of printable surface imperfections that have a dimension greater than ⅕ of the smallest printed feature dimension on wafer surface 50, such that the finished planar surface of the mask does not pollute the image printed on wafer surface 50. The reflective multilayer coated Ti doped high purity $SiO_2$ glass wafer surface 30 preferably reflects at least 65%, and more preferably reflects at least 70%, of the radiation $\lambda$ illuminating the reflective multilayer coating. In a preferred embodiment wafer surface 32 is unetched and free of an intermediate barrier layer or release layer so that multilayer reflective coating 34 is directly bonded thereto.

The invention further comprises a method of making a projection lithographic system and the method of projecting lithographic patterns that includes providing an illumination sub-system 36 with an extreme ultraviolet soft x-ray source 38 and providing a mask sub-system 22 with a mask receiving member 52 and a reflective mask Ti doped high purity $SiO_2$ glass mask wafer 24 with an unetched glass mask wafer surface 32 with an Ra roughness$\leq$0.15 nm coated with a reflective multilayer coating 34 having a reflectivity of at least 65% to extreme ultraviolet soft x-rays received in mask receiving member 52. The method further includes providing a projection sub-system 46 with a camera 54 having a depth of focus >1 $\mu$m and a numerical aperture NA$\leq$0.1; providing a radiation sensitive print sub-system 56 with a radiation sensitive print media 58; and aligning illumination sub-system 36, mask sub-system 22, projection sub-system 46, and radiation sensitive print sub-system 56 such that extreme ultraviolet soft x-ray source 38 illuminate reflective mask 24 with extreme ultraviolet soft x-ray radiation and reflective mask 24 reflects the radiation and forms a printing pattern of overlay 28 which is projected and reduced by projection sub-system camera 54 onto radiation sensitive print media 58.

The method includes providing a reflective mask 24 with a Ti doped high purity $SiO_2$ glass mask wafer 26 free of inclusions and wafer surface defects that are printable on radiation sensitive print media 58. Providing mask sub-system 22 including a reflective mask 24, includes providing a Ti doped high purity $SiO_2$ glass mask wafer preform having a preform surface and free of inclusions, and finishing the preform surface into a planar mask wafer surface having an Ra roughness$\leq$0.15 nm in accordance with the invention.

Figure 8:
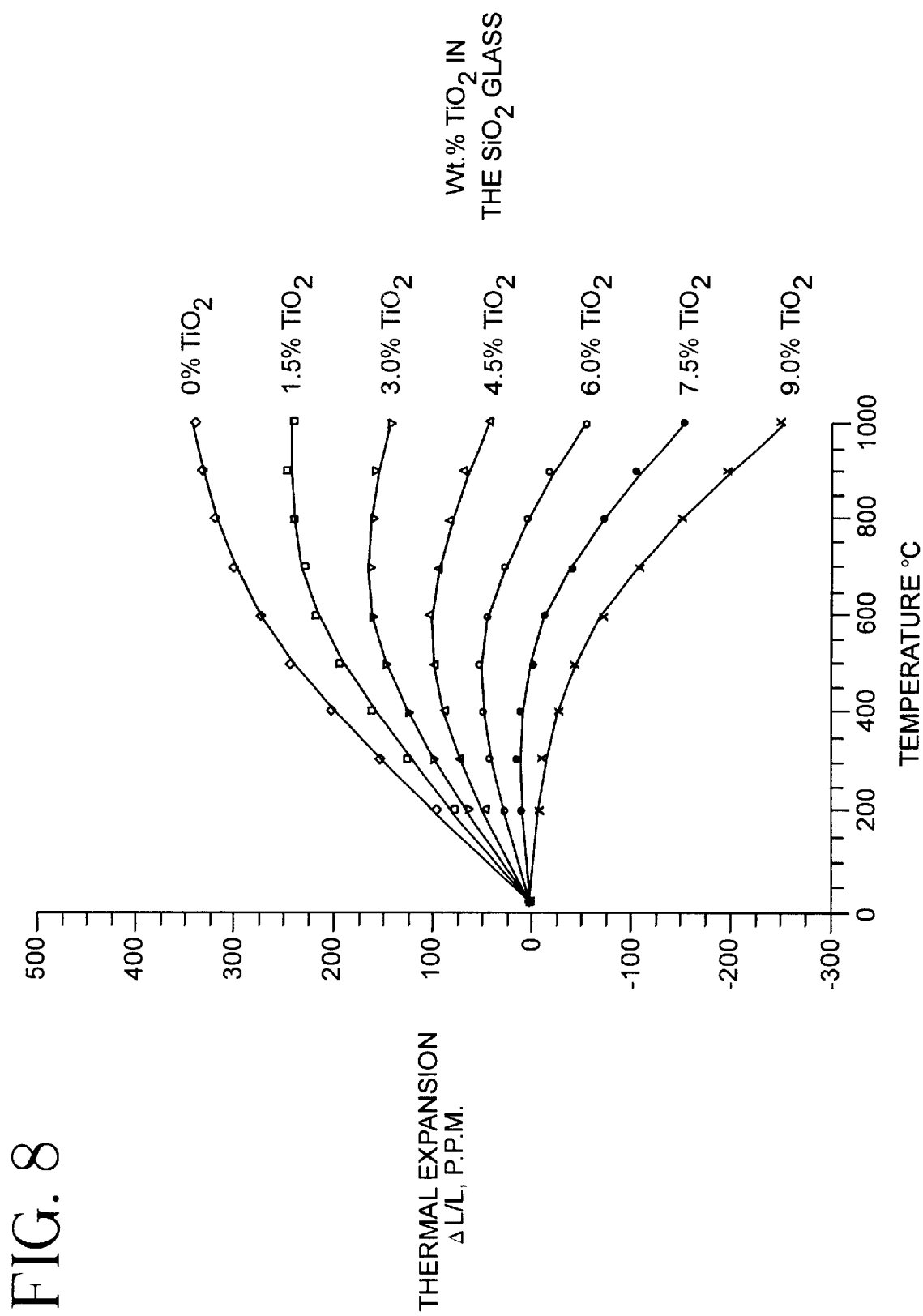
FIG. 8 a plot of Thermal Expansion (y-axis) versus Temperature (x-axis) for various wt. % $TiO_2$ levels in $SiO_2$ glass.

The method preferably includes determining an operating temperature of reflective mask 24 when illuminated by illumination sub-system 36 during operation of system 20 and providing a mask sub-system 22 with a reflective mask 24 includes providing a Ti doped high purity $SiO_2$ glass mask wafer having a coefficient of thermal expansion at the determined operating temperature centered about 0. Such tuning of the coefficient of thermal expansion is done by controlled variations of Ti dopant content in the $SiO_2$ glass as demonstrated by FIG. 8 which shows the thermal expansion characteristics for high purity $SiO_2$ glasses with $TiO_2$ wt. % from 0 to 9.0 wt. % $TiO_2$.

In a further embodiment of the method the Ti doped high purity $SiO_2$ glass mask wafer is heated to a raised temperature range by the extreme ultraviolet soft x-ray radiation and the Ti doped high purity $SiO_2$ glass has a coefficient of thermal expansion for the raised temperature range that is less than 10 ppb and greater than −10 ppb. Preferably the method includes providing a mask 24 and wafer 26 that is a thermal insulator (low thermal conductivity) with a thermal conductivity K $\leq$1.40 w/(m.° C.), preferably in the range from 1.25 to 1.38, most preferably about 1.31, and allowing wafer 26 to heat up without actively cooling wafer 26.

The invention further comprises a method of making a reflective extreme ultraviolet soft x-ray projection lithography mask 24 that includes providing a Ti doped high purity $SiO_2$ glass preform having a preform surface and free of inclusions, finishing the preform surface into a planar mask wafer surface 32 having an Ra roughness$\leq$0.15 nm, and coating the finished planar mask wafer surface having a Ra roughness$\leq$0.15 nm with a reflective multilayer coating 34 to form a reflective mask surface 30 having a reflectivity of at least 65% to extreme ultraviolet soft x-rays. The method further includes forming a patterned absorbing overlay 28 on reflective mask surface 30. Coating with a reflective multilayer coating preferably includes forming alternating smooth thin layers (≦4 nm thick) of a first element and a second element, such as Mo/Si or Mo/Be.

The alternating layers provide a soft x-ray extreme ultraviolet reflectivity peak, preferably centered about 13.4 nm. Such an alternating multilayer reflective coating functions similarly to a quarter wave stack, with the thickness of the layers optimized for constructive interference of the photons reflected at each interface and minimal absorption so a large number of interfaces contribute to the high reflectance of the coating. Preferably layer to layer variation in thickness is within 0.001 nm. In a preferred embodiment, the coating is 81 alternating layers of Mo and Si with Mo thickness about 2.8 nm and the Si thickness about 4.0 nm. With proper deposition conditions, reflectances of 68% or greater at 13.4 nm are achievable with such alternating layers. The 81 alternating layers of Mo and Si are preferably capped with a capping layer to prevent oxidation of the Mo on exposure to normal atmospheres, with a preferred capping layer being a 4 nm thick Si layer. The reflective coating 34 of mask 24 is then patterned using wafer processing steps to form a pattern in an absorbing layer deposited on top of the reflective coating.

The absorbing layer is comprised of an absorbing element such as Al, Ti or other soft x-ray extreme ultraviolet absorbing elements and is patterned with wafer processing steps such as optical exposure or e-beam direct write steps to form patterned absorbing layer 28. In a preferred embodiment, coating with a reflective multilayer coating and forming a patterned absorbing overlay includes, multilayer deposition on the Ti doped high purity $SiO_2$ glass wafer surface 32 which has an Ra roughness≦0.15 nm, then buffer layer deposition on top of multilayer reflective coating, then absorber deposition on top of buffer layer, than pattern generation lithography, then pattern transfer into absorber, and then buffer layer etch removal to result in reflective coating with patterned absorber layer, with the reflective coating having a reflectivity of at least 65% to extreme ultraviolet soft x-rays, preferably centered about 13.4 nm.

In the preferred embodiment, the reflective multilayer coating is directly deposited onto the Ti doped high purity $SiO_2$ glass wafer surface. The finished surface and the Ti doped high purity $SiO_2$ glass properties provide for directly depositing and bonding between the glass surface and the reflective multilayer coating without the complications of indirect coating and without the need for additional treatments of a substrate surface such as smoothing coating processes used with glass-ceramic crystalline containing substrate materials and remove the need for intermediate layers between the glass surface and the reflective multilayer coating. A superior and stable reflective mask is achieved with the direct bonding contact between the finished Ti doped high purity $SiO_2$ glass surface and the multilayer reflective coating.

Figure 6:
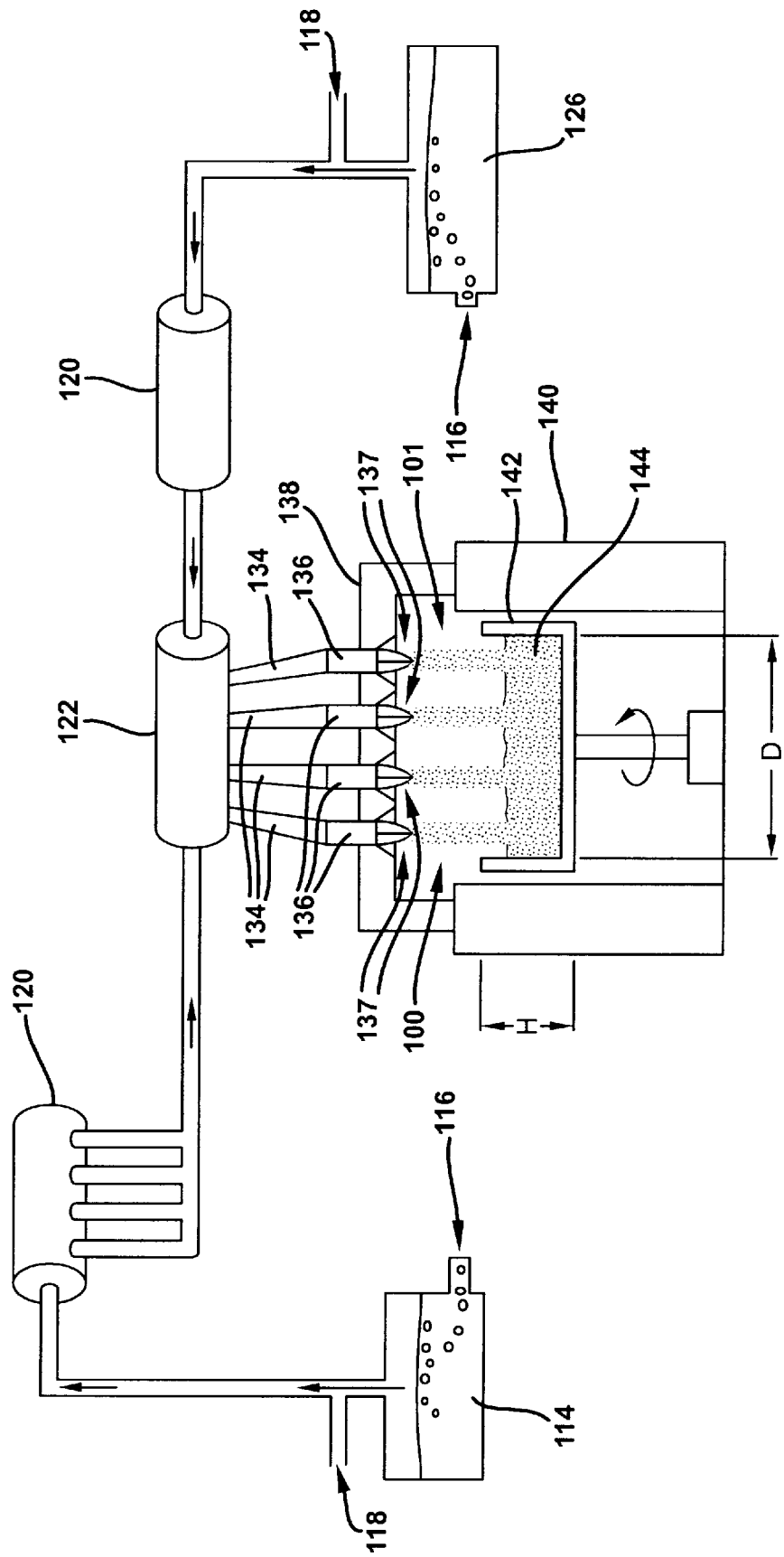
FIG. 6 a diagrammatic depiction of an embodiment of the invention.

Preferably providing a Ti doped high purity $SiO_2$ glass preform as shown in FIG. 6, includes providing a high purity Si containing feedstock 114 and a high purity Ti containing feedstock 126, delivering high purity Si containing feedstock 114 and high purity Ti containing feedstock 126 to a conversion site 100, converting the delivered feedstocks into Ti doped $SiO_2$ soot 101, depositing soot 101 in a revolving zircon collection cup 142 of refractory zircon furnace 140 onto the upper glass surface of hot Ti doped high purity $SiO_2$ glass body 144, concurrently with the soot deposition consolidating the Ti doped $SiO_2$ soot into an inclusion free homogeneous Ti doped high purity $SiO_2$ glass body 144 and forming glass body 144 into a Ti doped high purity $SiO_2$ glass preform. Preferably providing high purity Si containing feedstock 114 and high purity Ti containing feedstock 126 includes providing a chlorine-free high purity Si containing feedstock and providing a chlorine-free high purity Ti containing feedstock, converting the chlorine-free feedstocks into a chlorine-free Ti doped $SiO_2$ soot and consolidating the soot into a chlorine-free Ti doped $SiO_2$ glass. Preferably the Si feedstock is a siloxane, preferably a polymethylsiloxane, more preferably a polymethylcyclosiloxane, and most preferably high purity octamethylcyclotetrasiloxane (Si feedstock comprised of at least 99% octamethylcyclotetrasiloxane). Preferably the Ti feedstock is a titanium alkoxide, and more preferably titanium isopropoxide [Ti(OPri)$_4$], preferably with Ti feedstock comprised of at least 99% titanium isopropoxide. A nitrogen inert carrier gas 116 is bubbled through feedstocks 114 and 126, and a nitrogen inert carrier gas 118 is added to the Si feedstock vapor/carrier gas mixture and the Ti feedstock vapor/carrier gas mixture to prevent saturation and facilitate delivery of the feedstocks to conversion site 100, through distribution systems 120 and manifold 122. Preferably the Si feedstock is mixed with the Ti 30 feedstock in manifold 122 to form a homogeneous gaseous Ti doped $SiO_2$ glass precursor mixture which is delivered through conduits 134 to conversion site burners 136 mounted in the upper portion 138 of furnace 140 which produce conversion site burner flames 137, so that the feedstock mixture is converted into Ti doped $SiO_2$ soot 101 and then homogeneous Ti doped $SiO_2$ glass 144. The weight percent dopant content of $TiO_2$ in the $SiO_2$ glass can be adjusted by changing the amount of Ti feedstock delivered to conversion site 100 that is incorporated into soot 101 and glass 144. In a preferred method the Ti dopant weight percent level of glass 144 and preform 60 is adjusted so that wafer 26 has a coefficient of thermal expansion centered about 0 at an operating temperature of the mask incorporating wafer 26. In accordance with FIG. 8, adjustments to the wt. % $TiO_2$ in the high purity $SiO_2$ glass adjust the thermal expansion characteristics of the resultant glass wafer. Preferably the Ti dopant weight percent level of the glass is adjusted within the range from about 6 wt. % $TiO_2$ to about 9 wt. % $TiO_2$, most preferably in the range from 7 to 8 wt. %. Conversion site burner flames 137 are formed with a fuel/oxygen mixture (Natural Gas and/or $H_2$/with $O_2$) which combusts, oxidizes and converts the feedstocks at temperatures ≧ about 1600° C. into soot 101 and consolidates the soot into glass 144. The temperatures of conduits 134 and the feedstocks contained therein are preferably controlled and monitored to inhibit reactions prior to flames 137 which may disrupt the flow of the feedstocks and soot 101 and complicate the manufacturing process of glass 144. Preferably furnace 140 and particularly zircon cup 142 and upper portion 138 are made form high purity zircon refractory bricks which are free of alkali and alkaline earth metals, and other impurities which tend to migrate from the furnace and contaminate glass 144. Such high purity bricks can be obtained using high purity ingredients and calcining the bricks to leach out impurities.

Figure 7A:
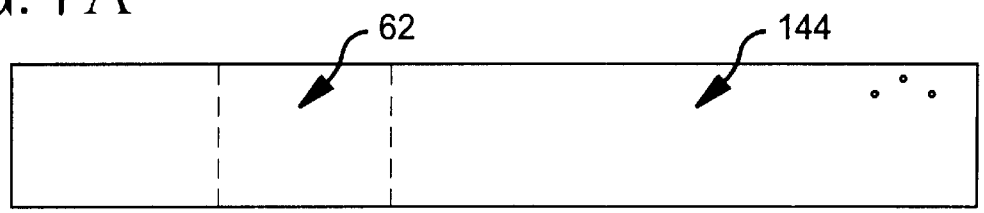
FIGS. 7A–7F are a manufacturing flow depiction of an embodiment of the invention.
Figure 7B:
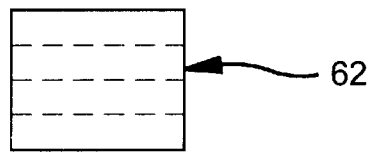
Figure 7C:
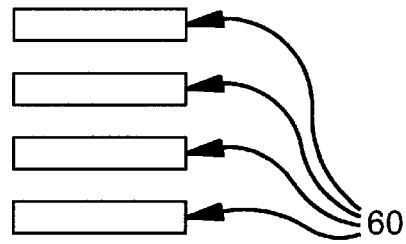
Figure 7D:
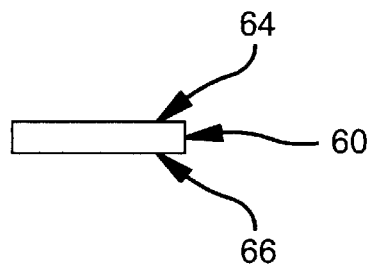
Figure 7E:
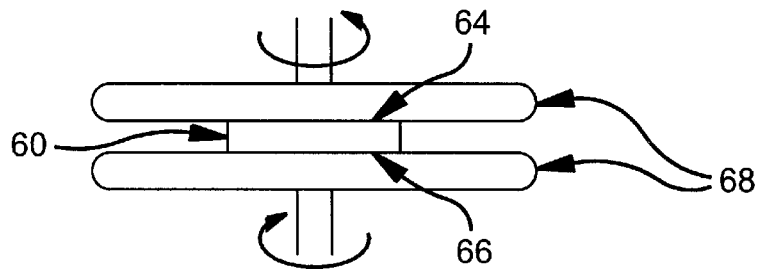
Figure 7F:
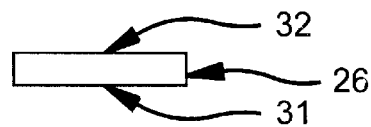

Preferably cup 142 has a circular diameter shape of at least 0.5 meters, more preferably at least 1 meter, so that glass body 144 is a cylindrical boule having a respective diameter of at least 0.5 meters, preferably 1 meter and a height of at least 8 cm, preferably at least 10 cm , with a preferred height in the range from 12 to 16 cm. Forming glass body 144 into a Ti doped high purity $SiO_2$ glass preform 60, preferably includes inspecting glass body 144 for any glass defects, such as inclusions, selecting defect free sections of glass body 144 such as defect free section 62 of glass body 144 shown in FIG. 7A, and removing the defect free section 62 from 144 as shown in FIG. 7B. Preforms 60 are then formed from removed defect free section 62 as shown in FIG. 7C. Preform 60 is preferably obtained by core drilling section 62 from body 144 and cutting removed section 62 into planar preforms 60 having a top planar surface 64 and a bottom planar surface 66 of appropriate size that allows finishing of planar preforms 60 into a mask wafer with a planar mask wafer surface having a roughness≦0.15 nm. As shown in FIG. 7E, planar preform 60 is finished by polishing a surface of preform 60. Preferably both the top surface 64 and the bottom surface 66 of preform 60 are polished with polishing wheels 68 to result in wafer 26. Preferably polishing preform 60 into wafer 26 includes at least two polishing steps. Preferably preform 60 is polished into a first polished preform surface having a roughness ranging from about 0.6 to 1.0 nm and then the polished preform surface is further polished into the planar mask wafer surface having a roughness≦0.15 nm. Preferably polishing includes polishing with colloidal particles which are finely distributed particles in a liquid medium (solution) that do not settle out of solution. All of the particles are less than 0.5 microns in size and the entire size distribution of the particles is less than 0.5 microns and are preferably spherically shaped and have a diameter less than 100 nm, preferably in the range from 20 to 50 nm. Preferably the colloidal particles are comprised of silica, titania, alumina, or ceria. Most preferably the invention includes polishing with colloidal silica, preferably colloidal silica doped with titanium.

As shown in FIG. 7E, the polishing steps of the invention comprise polishing both the top surface 64 and the opposing bottom surface 66 concurrently. Preferably polishing wheels 68 include polishing wheel pads that are formed from synthetic polymers and the rotating motion of the synthetic polymer wheel surface and the polishing agent remove parts of the preform surfaces 64 and 66 through a combination of chemical and physical mechanical action to provide the finished smooth surface on which the reflective multilayer coating is deposited. Preferably the finishing includes polishing the preform surface with a cerium oxide abrasive and hard polyurethane pads, then polishing with a cerium oxide abrasive and soft napped polyurethane pads, and then polishing with colloidal silica and soft polyurethane pads. In a preferred alternative embodiment the colloidal silica is doped with titanium. Preferably finishing includes polishing with an aqueous solution of at least one metal oxide and then polishing with an alkali aqueous solution of colloidal silica. After polishing with such polishing agents, the preform surfaces are cleaned to remove the polishing agents and provide cleaned wafer 26. Preferably the alkali aqueous solution of colloidal silica is buffered to a pH ranging from 8 to 12, preferably 10 to 12, and most preferably 10 to 11. The colloidal silica in the alkali aqueous solution through physical action removes any surface corrosion by the alkali solution and removes an continually-formed hydrated surface layer on the Ti doped $SiO_2$ glass.

The invention further includes reflective extreme ultraviolet soft x-ray mask wafer 26. The wafer comprises a Ti doped high purity $SiO_2$ inclusion-free glass wafer that has an unetched first polished planar face surface 32 and an opposing second polished planar face surface 31 with the first surface free of printable surface defects that have a dimension greater than 80 nm and having a roughness Ra≦0.15 nm. FIGS. 5A and 5B show such polished Ti doped high purity $SiO_2$ inclusion-free glass wafer surfaces. Preferably the second opposing surface 31 is also free of printable surface defects that have a dimension greater than 80 nm and has a roughness Ra≦0.15 nm. Preferably the wafer has a thickness dimension between the first surface and the second surface of at least about 1 mm, more preferably at least 5 mm, and most preferably in the ranges of 6 to 12 mm, and more preferably 6 to 8 mm. Preferably the Ti doped high purity $SiO_2$ inclusion free glass mask wafer is free of chlorine and has an impurity level of less than 10 ppb of the alkali and the alkaline earth metals.

The invention also includes a method of making a reflective extreme ultraviolet soft x-ray mask wafer that comprises providing a Ti doped high purity $SiO_2$ glass preform 60 having a first preform surface 64 and an opposing second preform surface 66 free of glass inclusions and finishing first preform surface 64 into a planar mask wafer surface having a roughness Ra≦0.15 nm. Preferably providing a Ti doped high purity $SiO_2$ glass preform includes providing a high purity Si containing feedstock 114 and high purity Ti containing feedstock 126, delivering feedstocks 114 and 126 to conversion site 100, converting feedstocks 114 and 126 into Ti doped $SiO_2$ soot 101, consolidating soot 101 into an inclusion free homogeneous Ti doped high purity $SiO_2$ glass and forming the glass into a Ti doped high purity $SiO_2$ glass preform 60. Preferably Si feedstock 114 is chlorine free and Ti feedstock 126 is chlorine free so that soot 101 and glass 144 is chlorine free. Preferably finishing first preform surface 64 into planar mask wafer surface 32 includes polishing surface 64 into a first polished preform surface having a surface roughness Ra ranging from about 0.6 to 1.0 nm and then further polishing the polished preform surface into a planar mask wafer surface having a roughness Ra≦0.15 nm. Preferably the polishing includes polishing with colloidal silica.

In a preferred embodiment the colloidal silica is doped with titania in a concentration of 4 to 10 wt.%. In a most preferred embodiment the method includes polishing opposing second preform surface 66 concurrently with polishing first surface 64. The finishing includes polishing the preform surface with an aqueous solution of at least one metal oxide and polishing the surfaces with an alkali solution of colloidal silica. Preferably the preform 60 surfaces are first polished with a cerium oxide abrasive and a hard polyurethane synthetic polymer blown pad, then with a cerium oxide abrasive and a soft napped polyurethane synthetic polymer pad and then polished with colloidal silica and a soft polyurethane synthetic polymer pad. In a preferred embodiment the colloidal silica is doped with titanium. Preferably the preform has a thickness >8 mm and the preform is finished to provide a wafer 26 having a thickness>6 mm. The finishing step in addition to polishing the preform surfaces with polishing agents, includes cleaning the preform surfaces to remove the polishing agents to provide a clean smooth surface for contact with the reflective multilayer coating. Preferably the step of providing a preform includes adjusting the Ti dopant weight percent level of the Ti doped high purity $SiO_2$ glass preform so that the mask wafer has a coefficient of thermal expansion centered about 0 at an operating temperature of the reflective extreme ultraviolet soft x-ray mask.

The inventive method of making a reflective extreme ultraviolet soft x-ray mask wafer provides an economic means for efficiently manufacturing large quantities of mask wafers which can enable the utilization of extreme ultraviolet soft x-ray projection lithography for the mass production of integrated circuits with printed feature dimensions less than 100 nm. Additionally, the inventive method of making a reflective mask Ti doped high purity $SiO_2$ glass wafer 26 includes the beneficial steps of inspecting and qualifying the finished top wafer surface 32 to ensure that the surface has proper roughness and is defect free, and additionally inspecting and qualifying the finished bottom wafer surface 31 to determine the roughness and defect free qualifications of the opposing second glass wafer surface. Preferably, AFM is used in such inspection and qualification. This improves the selection and yield of mask wafers for coating and further utilizing as part of the mask system for extreme ultraviolet soft x-ray projection lithography.

During use of the patterned reflective extreme ultraviolet soft x-ray mask, the Ti doped $SiO_2$ glass wafer has a lithography operating temperature. The operating temperature of the $SiO_2$ glass wafer include a maximum operating temperature. During the making of the patterned reflective extreme ultraviolet soft x-ray mask, the Ti doped $SiO_2$ glass is exposed to manufacturing treatment temperatures. The manufacturing treatment temperatures include elevated temperatures during cutting, machining, finishing, and coating. The manufacturing treatment temperatures include a maximum manufacturing temperature. Preferably the Ti doped $SiO_2$ glass wafer is crystallization resistant and has a crystallization temperature $T_{crystal}$ at which crystallization in the glass is induced, with $T_{crystal}$ being substantially greater than the maximum operating temperature and the maximum manufacturing temperature. Preferably $T_{crystal}$ is at least 400° C. higher than the greater of the maximum operating temperature and the maximum manufacturing temperature, more preferably at least 700° C. higher, and most preferably at least 800° C. higher. Preferably $T_{crystal}$ is $\geq$1300° C., with the maximum operating temperature and maximum manufacturing temperature not exceeding 500° C. With the Ti doped $SiO_2$ glass, the crystallization of the glass is inhibited at the elevated temperatures experienced during manufacturing and use of the mask. The glass wafer is thus beneficial in that it has a high temperature crystallization behavior.

Additionally, in view of the manufacturing treatment temperatures and the lithography operating temperatures, the Ti doped $SiO_2$ glass maintains its physical dimensions when exposed to thermal cycling. In the use and manufacture of the Ti doped $SiO_2$ glass wafer reflective mask repeated thermal cycling between lower temperatures and higher temperatures do not substantially charge the physical dimensions of the glass wafer. Preferably the Ti doped $SiO_2$ glass is resistant to thermal cycling hysteresis, and most preferably is free of thermal cycling hysteresis when repeatedly cycled (>100 cycles) from the lowest lithography operating temperature to the highest lithography operating temperature. Most preferably physical dimensions of the glass wafer do not measurably change when repeatedly cycled from a low temperature to a high temperature that are below 300° C. with the low temperature proximate to 0° C. and the high temperature proximate to 300° C.

In a preferred embodiment, the Ti doped $SiO_2$ glass wafer has a birefringence resulting from permanent strain in the glass of less than 10 nm/cm, and more preferably is less than 2 nm/cm. Preferably birefringence less than 2 nm/cm is achieved by providing a constant homogeneous distribution of Ti dopant throughout the $SiO_2$ glass with the coefficient of thermal expansion in the range from +10 ppb to −10 ppb at 20° C., with the maximum fluctuation in the coefficient of thermal expansion being less than 10 ppb, most preferably less than 5 ppb. Additionally, low birefringence may be obtained by annealing the Ti doped $SiO_2$ glass. Preferably the Ti doped $SiO_2$ glass is annealed at a temperature of at least 900° C., more preferably at least 1000° C., and most preferably at least 1030° C. after the glass has experienced stress, such as from machining.

Ensuring such low birefringence levels is preferably achieved by monitoring the coefficient of thermal expansion of the Ti doped $SiO_2$ glass by transmitting ultrasonic waves through the glass and measuring the transit time of the ultrasonic waves through the glass to determine the ultrasonic velocity and expansivity characteristics of the glass exposed to the ultrasonic waves. Preferably such measurement and monitoring of the Ti doped $SiO_2$ glass is utilized throughout the mask manufacturing process. Such ultrasonic measurements are preferably utilized for quality control, inspection, and selection. Such measurement are preferably utilized to insure the manufacturing of glass body 144 is providing a constant homogeneous distribution of Ti dopant. Additionally, such measurements are used in inspecting glass body 144 and selecting sections 62 to be cut from glass body 144. Further such measurements may be utilized to insure that undue stresses are not formed in the glass during later manufacturing stages such as finishing and also used as a determining factor if further annealing of the glass is required.

EXAMPLE

FIGS. 5A–5B are AFM photomicrographs of a Ti doped high purity $SiO_2$ glass wafer surface. FIGS. 5A–5B were taken at two separate locations on the same finished wafer sample top surface. The mask wafer sample was obtained by finishing a Ti doped high purity $SiO_2$ glass preform that was free of inclusions. The preform had a square shape with approximately 7.6 cm sides and a thickness of approximately 0,64 cm. The square preform was obtained by cutting the preform from an inclusion free area of a Ti doped high purity $SiO_2$ glass boule that had a cylindrical shape of approximately 152 cm diameter and a 14 cm thickness (height). The boule was produced from octamethylcyclotetrasiloxane and titanium isopropoxide feedstocks in accordance with FIG. 6 of the invention with the Ti doped high purity $SiO_2$ glass having a $TiO_2$ wt. % of about7.5 wt. %. The square preform were finished into a planar mask wafer using a double sided lapping/polishing machine. The square preform was first lapped using 7 micron alumina abrasives on cast iron plate to remove approximately 20/1000 inches (0.0508 cm) of the preform thickness. Then it was polished on blown synthetic polyurethane hard pad (Rodel Inc., 3804 E. Watkins Street, Phoenix, Ariz. Rodel MHC-14B brand blown polyurethane pad) for one hour using cerium oxide (Rodia Inc., 3 Enterprise Drive, Shelton, Conn.; Rodia (Rhone-Poulence) Opaline brand cerium oxide) at 1.5 psi (0.1055 kg/$cm_2$) and 50 RPMs. The preform was then polished on napped synthetic polyurethane soft pad (Rodel Inc., Rodel204 Pad brand napped polyurethane pad) for twenty minutes using cerium oxide (Universal Photonics Inc., 495 W. John Street, Hicksville, N.Y.; Universal Photonics Hastelite 919 brand cerium oxide) at 1.5 psi (0.1055 kg/$cm_2$) and 50 RPMs. The preform was then polished on napped synthetic polyurethane soft pad (Rodel 204 Pad brand napped polyurethane pad) for five to ten minutes using colloidal silica (Cabot Corp., 75 State Street, Boston, Mass. Cabot A2095 brand colloidal silica) at 1.5 psi (0.1055 kg/$cm_2$) and 50 RPMs. The resulting planar mask wafer was then analyzed, measured, and qualified using AFM with the resulting surface of FIGS. 5A–5B. The finished Ti doped $SiO_2$ glass wafer surface has an Ra roughness$\leq$0.15 nm. In a preferred embodiment the Ti doped $SiO_2$ glass wafer surface of the invention is defect free with an Ra roughness$\leq$0.10 nm, more preferably Ra roughness$\leq$0.09 nm, and most preferably Ra roughness$\leq$0.086 nm. Additionally, the Ti doped $SiO_2$ glass wafer surface preferably has an RMS roughness≦0.15 nm, and average height≦0.5 nm with a maximum range≦0.9 nm.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

We claim:

1. A projection lithographic method for producing integrated circuits with printed feature dimensions less than 100 nm, said method comprising:

providing an illumination sub-system for producing and directing an extreme ultraviolet soft x-ray radiation $\lambda$, said illumination sub-system including an extreme ultraviolet soft x-ray source, providing a mask sub-system illuminated by said extreme ultraviolet soft x-ray radiation $\lambda$ produced by said illumination sub-system, providing a mask sub-system patterned reflective lithographic mask for forming a projected mask lithographic pattern when illuminated by said radiation $\lambda$, said patterned reflective mask including a Ti doped $SiO_2$ glass wafer with a patterned $\lambda$ absorbing overlay overlaying a $\lambda$ reflective multilayer coated Ti doped $SiO_2$ glass defect-free wafer surface that has an Ra roughness≦0.15 nm, providing a projection sub-system, providing an integrated circuit wafer, said integrated circuit wafer having a $\lambda$ radiation sensitive wafer surface, and projecting with said projection sub-system the projected mask pattern from said patterned reflective mask onto said radiation sensitive wafer surface.

2. A method as claimed in claim 1 wherein said Ti doped $SiO_2$ glass wafer is inclusion free.

3. A method as claimed in claim 1 wherein said Ti doped $SiO_2$ glass wafer surface is an unetched glass surface.

4. A method as claimed in claim 1 wherein said Ti doped $SiO_2$ glass wafer is substantially non-transmissive to said extreme ultraviolet soft x-ray radiation $\lambda$.

5. A method as claimed in claim 1 wherein said Ti doped $SiO_2$ glass wafer is chlorine-free.

6. A method as claimed in claim 1 wherein said Ti doped $SiO_2$ glass wafer has an impurity level of less than 10 ppm Cl, less than 10 ppm of alkali and alkaline earth metals.

7. A method as claimed in claim 1 wherein said Ti doped $SiO_2$ glass wafer contains from 5 to 10 wt. % $TiO_2$ and has a coefficient of thermal expansion in the range from +30 ppb to −30 ppb at 20° C.

8. A method as claimed in claim 7 wherein said coefficient is in the range of +10 ppb to −10 ppb at 20° C.

9. A method as claimed in claim 8 wherein said wafer has a variation in coefficient of thermal expansion≦15 ppb.

10. A method as claimed in claim 1 wherein said wafer has a thermal conductivity K≦1.40 w/(m×° C.) at 25° C.

11. A method as claimed in claim 1 wherein said Ti doped $SiO_2$ glass wafer is heated by said radiation $\lambda$, and said patterned absorbing overlay is substantially unaffected by said heating of the glass wafer.

12. A method as claimed in claim 2 wherein Ti doped $SiO_2$ glass defect-free wafer surface has a finished planar surface.

13. A method as claimed in claim 12 wherein said finished planar surface is free of printable surface imperfections that have a dimension greater than 80 nm.

14. A method as claimed in claim 12 wherein said finished planar surface is free of printable surface imperfections that have a dimension greater than ⅕ the printed feature dimension.

15. A method as claimed in claim 7, wherein said Ti doped $SiO_2$ glass wafer is heated to an operating temperature by said radiation $\lambda$ and said Ti doped $SiO_2$ glass wafer has a Ti dopant level such that said glass wafer has a coefficient of thermal expansion at said operating temperature centered about 0.

16. A method as claimed in claim 1 wherein said reflective multilayer coated Ti doped $SiO_2$ glass wafer surface reflects at least 65% of the radiation $\lambda$ illuminating the reflective multilayer coated Ti doped.

17. A method as claimed in claim 16 wherein said reflective multilayer coated Ti doped $SiO_2$ glass wafer surface reflects at least 70% of the radiation $\lambda$.

18. A method as claimed in claim 16 wherein said reflective multilayer is directly coated on said Ti doped $SiO_2$ glass wafer surface.

19. A method as claimed in claim 1 wherein said Ti doped $SiO_2$ glass wafer has an OH content less than 1200 ppm.

20. A method as claimed in claim 1 wherein said reflective lithographic mask elements has a maximum operating temperature and a maximum manufacturing temperature and said Ti doped high purity $SiO_2$ glass has a crystallization temperature $T_{crystal}$ which is greater than said maximum operating temperature and said maximum manufacturing temperature.

21. A method as claimed in claim 20 wherein $T_{crystal}$ is at least 400° C. higher than said maximum operating temperature and said maximum manufacturing temperature.

22. A method as claimed in claim 21 wherein $T_{crystal}>1100°$ C.

23. A method as claimed in claim 1 wherein said reflective lithographic mask has a lowest lithography operating temperature and a highest lithography operating temperature, said Ti doped high purity $SiO_2$ glass free of thermal cycling hystersis when repeatedly cycled at least a hundred times from said lowest lithography operating temperature to said highest lithography operating temperature.

24. A method as claimed in claim 1 wherein said Ti doped high purity $SiO_2$ glass has a birefringence less than 10 nm/cm.

25. A method of making a projection lithographic printing pattern, said method comprising:

providing an illumination sub-system including an extreme ultraviolet soft x-ray source, providing a mask sub-system, said mask sub-system including a mask receiving member and a reflective mask Ti doped high purity $SiO_2$ glass mask wafer with an unetched glass mask wafer surface coated with a reflective multilayer coating having a reflectivity of at least 65% to extreme ultraviolet soft x-rays, said reflective mask received by said mask receiving member, providing a projection sub-system, said projection sub-system including a camera with a depth of focus≧1 $\mu$m and a numerical aperture NA≦0.1, providing a radiation sensitive print sub-system, said radiation sensitive print sub-system including a radiation sensitive print media, aligning said illumination sub-system, said mask sub-system, said projection sub-system, and said radiation sensitive print sub-system wherein said extreme ultraviolet soft x-ray source illuminates said reflective mask with extreme ultraviolet soft x-ray radiation, said reflective mask reflects said radiation and forms a printing pattern which is projected by said projection sub-system camera onto said radiation sensitive print media.

26. A method as claimed in claim 25, wherein providing a mask sub-system including a reflective mask, includes providing a reflective mask with a wafer surface that has an Ra roughness≦0.15 nm.

27. A method as claimed in claim 25, wherein providing a mask sub-system including a reflective mask, includes providing a reflective mask Ti doped high purity $SiO_2$ glass mask wafer free of wafer surface defects that are printable on said radiation sensitive print media.

28. A method as claimed in claim 25, wherein providing a mask sub-system including a reflective mask, includes providing a Ti doped high purity $SiO_2$ glass mask wafer preform having a preform surface and free of inclusions and finishing said preform surface into a planar mask wafer surface having an Ra roughness≦0.15 nm.

29. A method as claimed in claim 25, further comprising, determining an operating temperature of said reflective mask when illuminated by said illumination sub-system during operation of said projection lithographic sub-systems, and providing a mask sub-system with a reflective mask includes providing a Ti doped high purity $SiO_2$ glass mask wafer having a coefficient of thermal expansion at said reflective mask operating temperature centered about 0.

30. A method as claimed in claim 25, wherein said Ti doped high purity $SiO_2$ glass mask wafer is heated to a raised temperature range by said extreme ultraviolet soft x-ray radiation and said Ti doped high purity $SiO_2$ glass has a coefficient of thermal expansion for said raised temperature range that is less than 10 ppb and greater than −10 ppb.

31. A method as claimed in claim 30 wherein said glass has a variation in coefficient of thermal expansion≦10 ppb.

32. A method as claimed in claim 25 wherein said Ti doped high purity $SiO_2$ glass mask has a thermal conductivity K≦1.40 w/(m×° C.) at 25° C.

33. A method of making a reflective extreme ultraviolet soft x-ray mask, said method comprising:

providing a Ti doped high purity $SiO_2$ glass preform having a preform surface and free of inclusions, finishing said preform surface into a planar mask wafer surface having an Ra roughness≦0.15 nm, coating said finished planar mask wafer surface having an Ra roughness≦0.15 nm with a reflective multilayer coating to form a reflective mask surface having a reflectivity of at least 65% to extreme ultraviolet soft x-rays.

34. A method as claimed in claim 33, further comprising forming a patterned absorbing overlay on said reflective mask surface.

35. A method as claimed in claim 33, wherein providing a Ti doped high purity $SiO_2$ glass preform further includes, providing a high purity Si containing feedstock and a high purity Ti containing feedstock, delivering said high purity Si containing feedstock and said high purity Ti containing feedstock to a conversion site, converting said Si containing feedstock and said Ti containing feedstock into Ti doped $SiO_2$ soot, consolidating said Ti doped $SiO_2$ soot into an inclusion free homogeneous Ti doped high purity $SiO_2$ glass, forming said glass into a Ti doped high purity $SiO_2$ glass preform.

36. A method as claimed in claim 35, wherein providing a high purity Si containing feedstock and a high purity Ti containing feedstock includes providing a chlorine-free high purity Si containing feedstock and providing a chlorine-free high purity Ti containing feedstock, converting said chlorine-free feedstocks into chlorine-free Ti doped $SiO_2$ soot, and consolidating said soot into a chlorine-free Ti doped $SiO_2$ glass.

37. A method as claimed in claim 33 wherein finishing said preform surface into a planar mask wafer surface further comprises polishing said preform surface into a first polished preform surface having a surface Ra roughness ranging from about 0.6 to 1.0 nm, and further polishing said polished preform surface into said planar mask wafer surface having an Ra roughness≦0.15 nm.

38. A method as claimed in claim 37 wherein further polishing includes polishing with colloidal particles.

39. A method as claimed in claim 33 wherein said preform has an opposing second preform surface and finishing said preform surface further comprising second preform surface concurrently with polishing said preform surface.

40. A method as claimed in claim 33 wherein finishing further includes polishing said preform surface with a synthetic polymer pad.

41. A method as claimed in claim 39 wherein finishing further includes polishing said preform surface with a cerium oxide abrasive and a hard polyurethane pad, then polishing with a cerium oxide abrasive and a soft polyurethane pad, and then polishing with a colloidal silica and a soft polyurethane pad.

42. A method as claimed in claim 33 wherein finishing further includes polishing said preform surface with an aqueous solution of at least one metal oxide and then polishing said preform surface with an alkali aqueous solution of colloidal silica.

43. A method as claimed in claim 33 wherein finishing said preform surface includes polishing said preform surface with polishing agents and then cleaning said preform surface to remove said polishing agents.

44. A method as claimed in claim 33, wherein said glass preform has a Ti dopant weight percent level and providing a Ti doped high purity $SiO_2$ glass preform further includes adjusting said Ti dopant weight percent level so that said mask has a coefficient of thermal expansion centered about 0 at an operating temperature of said mask.

45. A reflective extreme ultraviolet soft x-ray mask wafer comprising:

a Ti doped high purity $SiO_2$ inclusion-free glass wafer free of chlorine and having an unetched first polished face surface and an opposing second polished planar face surface, said first surface free of printable surface defects that have a dimension greater than 80 nm and having an Ra roughness≦0.15 nm.

46. A reflective extreme ultraviolet soft x-ray mask wafer comprising:

a Ti doped high purity $SiO_2$ inclusion-free glass wafer with an impurity level of less than 10 ppm of alkali and alkaline earth metals and having an unetched first polished face surface and an opposing second polished planar face surface, said first surface free of printable surface defects that have a dimension greater than 80 nm and having an Ra roughness≦0.15 nm.

47. A method of making a reflective extreme ultraviolet soft x-ray mask wafer, said method comprising:

providing a chlorine-free high purity Si containing feedstock and a chlorine-free high purity Ti containing feedstock, delivering said chlorine-free high purity Si containing feedstock and said chlorine-free high purity Ti containing feedstock to a conversion site, converting said chlorine-free high purity Si containing feedstock and said chlorine-free high purity Ti containing feedstock into chlorine-free Ti doped $SiO_2$ soot, consolidating said chlorine-free Ti doped $SiO_2$ soot into a chlorine-free inclusion free homogeneous Ti doped high purity $SiO_2$ glass body, forming said glass body into a chlorine-free Ti doped high purity $SiO_2$ glass preform free of inclusions and having a first preform surface and, finishing said first preform surface into a planar mask wafer surface having an Ra roughness $\leqq 0.15$ nm.

\* \* \* \* \*